(12) United States Patent
Wu et al.

(10) Patent No.: US 11,670,650 B2
(45) Date of Patent: Jun. 6, 2023

(54) SEMICONDUCTOR DEVICE AND METHOD OF MANUFACTURING THE SAME

(71) Applicant: TAIWAN SEMICONDUCTOR MANUFACTURING CO., LTD., Hsinchu (TW)

(72) Inventors: Zong-Jie Wu, New Taipei (TW); Chiao-Chi Wang, Taoyuan (TW); Chung-Chuan Tseng, Hsinchu (TW); Chia-Ping Lai, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 127 days.

(21) Appl. No.: 16/894,647

(22) Filed: Jun. 5, 2020

(65) Prior Publication Data

US 2021/0098514 A1 Apr. 1, 2021

Related U.S. Application Data

(60) Provisional application No. 62/907,464, filed on Sep. 27, 2019.

(51) Int. Cl.
*H01L 27/146* (2006.01)

(52) U.S. Cl.
CPC .. *H01L 27/14607* (2013.01); *H01L 27/14623* (2013.01); *H01L 27/14643* (2013.01); *H01L 27/14685* (2013.01); *H01L 27/14689* (2013.01)

(58) Field of Classification Search
CPC ......... H01L 27/14607; H01L 27/14643; H01L 27/14689
See application file for complete search history.

(56) References Cited

U.S. PATENT DOCUMENTS

| | | | | |
|---|---|---|---|---|
| 9,059,068 B2* | 6/2015 | Wei | ................ | H01L 27/14687 |
| 9,123,606 B2* | 9/2015 | Wei | ................ | H01L 27/14689 |
| 10,680,030 B2* | 6/2020 | Hatabu | ............ | H01L 27/14641 |
| 10,790,321 B2* | 9/2020 | Wei | ................ | H01L 27/14636 |
| 11,183,523 B2* | 11/2021 | Wei | ................ | H01L 27/14621 |
| 2004/0005729 A1* | 1/2004 | Abe | .................. | H01L 31/0232 |
| | | | | 257/53 |
| 2015/0091065 A1* | 4/2015 | Wei | ..................... | H01L 31/028 |
| | | | | 438/60 |
| 2015/0171131 A1* | 6/2015 | Abe | .................. | H01L 31/0232 |
| | | | | 257/432 |
| 2015/0221686 A1* | 8/2015 | Wei | ................. | H01L 27/14612 |
| | | | | 257/292 |

(Continued)

*Primary Examiner* — Mounir S Amer
*Assistant Examiner* — Alexander Belousov
(74) *Attorney, Agent, or Firm* — Maschoff Brennan

(57) ABSTRACT

A semiconductor device includes a first semiconductor structure and a second semiconductor structure. The first semiconductor structure includes silicon. The second semiconductor structure is embedded in the first semiconductor structure, in which the second semiconductor structure has at least one convex portion and at least one concave portion. The convex portion and the concave portion are on at least one edge of the second semiconductor structure, and a shape of the concave portion includes rectangle, trapezoid, inverted trapezoid, or parallelogram. The second semiconductor structure includes germanium, elements of group III or group V, or combinations thereof.

20 Claims, 15 Drawing Sheets

(56) References Cited

U.S. PATENT DOCUMENTS

| | | | |
|---|---|---|---|
| 2016/0201123 A1* | 7/2016 | Leobandung | H01L 31/18 |
| | | | 438/87 |
| 2019/0057999 A1* | 2/2019 | Hatabu | H01L 27/14607 |
| 2019/0103428 A1* | 4/2019 | Wei | H01L 27/14621 |
| 2020/0058689 A1* | 2/2020 | Wei | H01L 27/14636 |
| 2021/0098514 A1* | 4/2021 | Wu | H01L 27/14623 |
| 2021/0399029 A1* | 12/2021 | Ohura | H01L 27/14683 |
| 2022/0077206 A1* | 3/2022 | Wei | H01L 27/14641 |

* cited by examiner

SEMICONDUCTOR DEVICE AND METHOD OF MANUFACTURING THE SAME

PRIORITY CLAIM AND CROSS-REFERENCE

This application claims priority to U.S. Provisional Application Ser. No. 62/907,464, filed Sep. 27, 2019, which is herein incorporated by reference.

BACKGROUND

The semiconductor integrated circuit (IC) industry has experienced rapid growth. Technological advances in integrated circuit materials and design have produced generations of integrated circuits where each generation has smaller and more complex circuits than the previous generation. In the course of integrated circuit evolution, functional density (i.e., the number of interconnected devices per chip area) has generally increased while geometric size (i.e., the smallest component that can be created using a fabrication process) has decreased. Such advances have increased the complexity of processing and manufacturing integrated circuits. For these advances, similar developments in integrated circuit processing and manufacturing are developed.

Front side illuminated (FSI) image sensors and back side illuminated (BSI) image sensors are two types of image sensors. The front side illuminated image sensors are operable to detect light projected from their front side while the back side illuminated image sensors are operable to detect light projected from their backside. When light projected into the front side illuminated image sensors or the back side illuminated image sensors, photoelectrons are generated and then are sensed by light-sensing devices in pixels of the image sensors. The more the photoelectrons are generated, the more superior quantum efficiency (QE) the image sensor has, thus improving the image quality of the image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
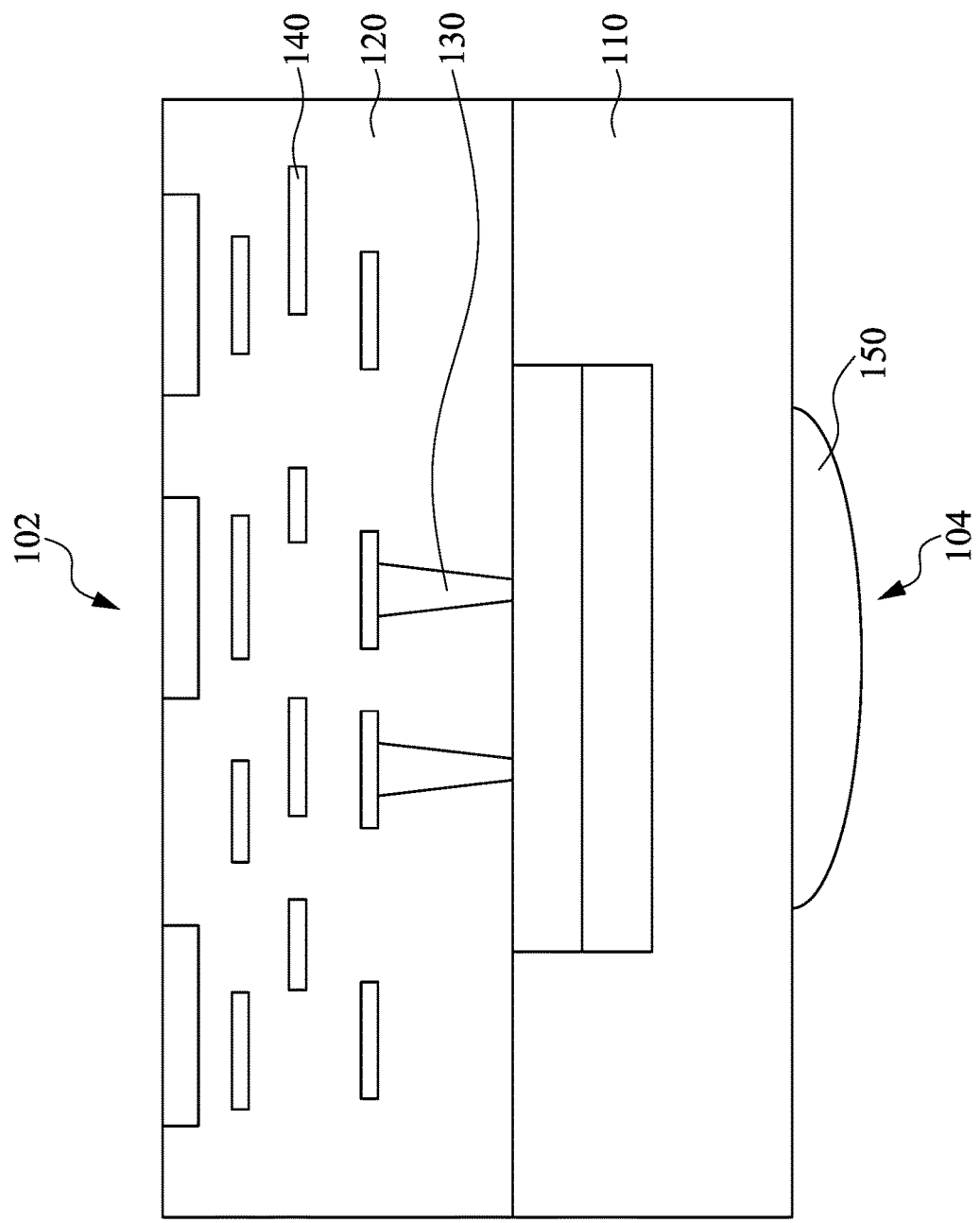
FIG. 1 is a cross-sectional view illustrating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100 in accordance with some embodiments of the present disclosure. In some embodiments, the semiconductor device 100 is an image sensor device. The semiconductor device 100 has a front side 102 and a back side 104. In some embodiments, the semiconductor device 100 is a back side illuminated (BSI) image sensor device, which is operated to sense the incident light projected from its back side 104. Furthermore, FIG. 1 may illustrate only a portion of the semiconductor device 100. As shown in FIG. 1, the semiconductor device 100 may include a semiconductor substrate 110, a dielectric layer 120, conductive contacts 130, metallization layers 140, and micro-lens 150. The dielectric layer 120 overlies the semiconductor substrate 110 from the front side 102 of the semiconductor device 100. The conductive contacts 130 and the metallization layers 140 are formed within the dielectric layer 120. The micro-lens 150 overlies the semiconductor substrate 110 from the back side 104 of the semiconductor device 100.

It is noted that while the front side 102 of the semiconductor device 100 is depicted facing upwards in the figures, the position of the semiconductor substrate 110 and the overlying layers are arbitrary in the figures, and rotating the semiconductor device 100 does not change the functions and relative positions of the elements shown. As depicted in the figures, the back side 104 of the semiconductor substrate is shown oriented facing downwards; however, this does not change which portion is the back side 104 of the semiconductor device 100, even when the orientation is different.

FIGS. 2-5 are cross-sectional views illustrating a method for manufacturing the semiconductor device 100 shown in FIG. 1 at various stages according to some embodiments.

Figure 2:
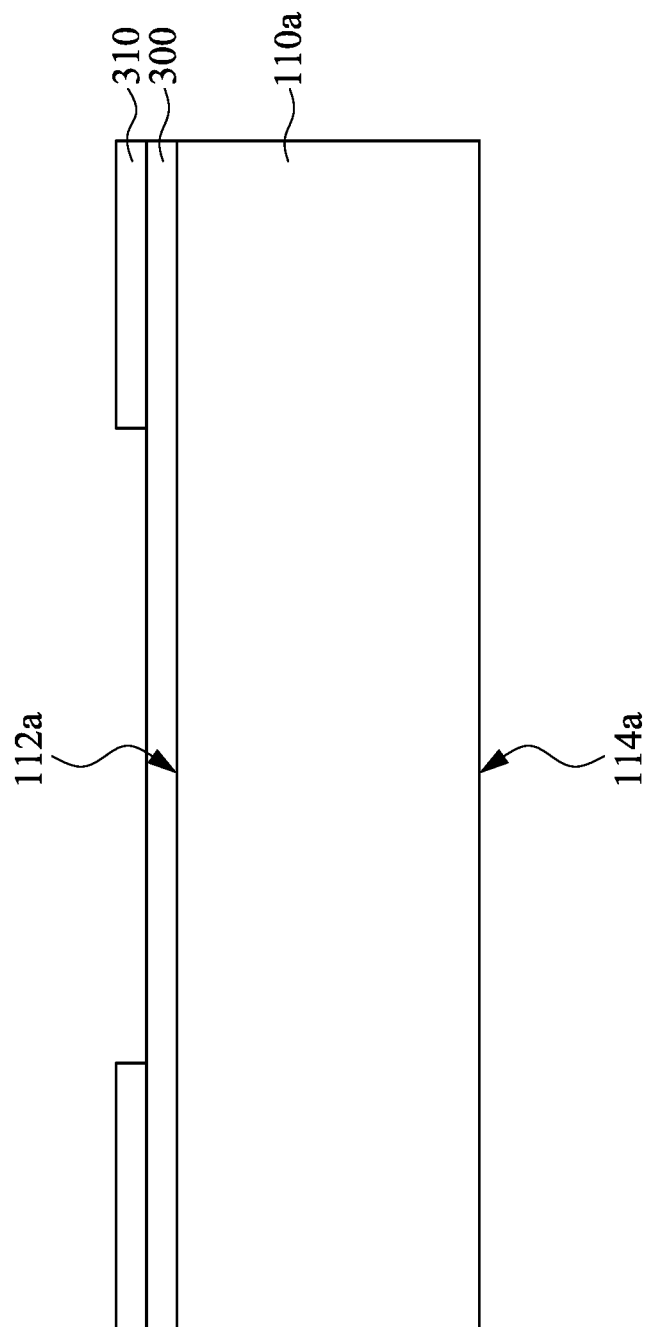
FIGS. 2-5 are cross-sectional views illustrating a method for manufacturing the semiconductor device shown in FIG. 1 at various stages according to some embodiments.

Reference is made to FIG. 2. A first semiconductor structure 110a with a first surface 112a and a second surface 114a facing away from the first surface 112a is provided. In some embodiments, the first semiconductor structure 110a includes silicon. As shown in FIG. 2, a hard mask layer 300 is disposed to cover the first surface 112a of the first semiconductor structure 110a. In some embodiments, the hard mask layer 300 includes silicon oxide, silicon nitride or silicon oxynitride. Furthermore, a patterning layer 310 is formed on the hard mask layer 300 to expose a portion of the hard mask layer 300. In some embodiments, the patterning layer 310 may include a photoresist material. Although not illustrated herein, the patterning layer 310 may be formed by subsequently performing an exposure process and a development process to pattern the patterning layer 310.

Figure 3:
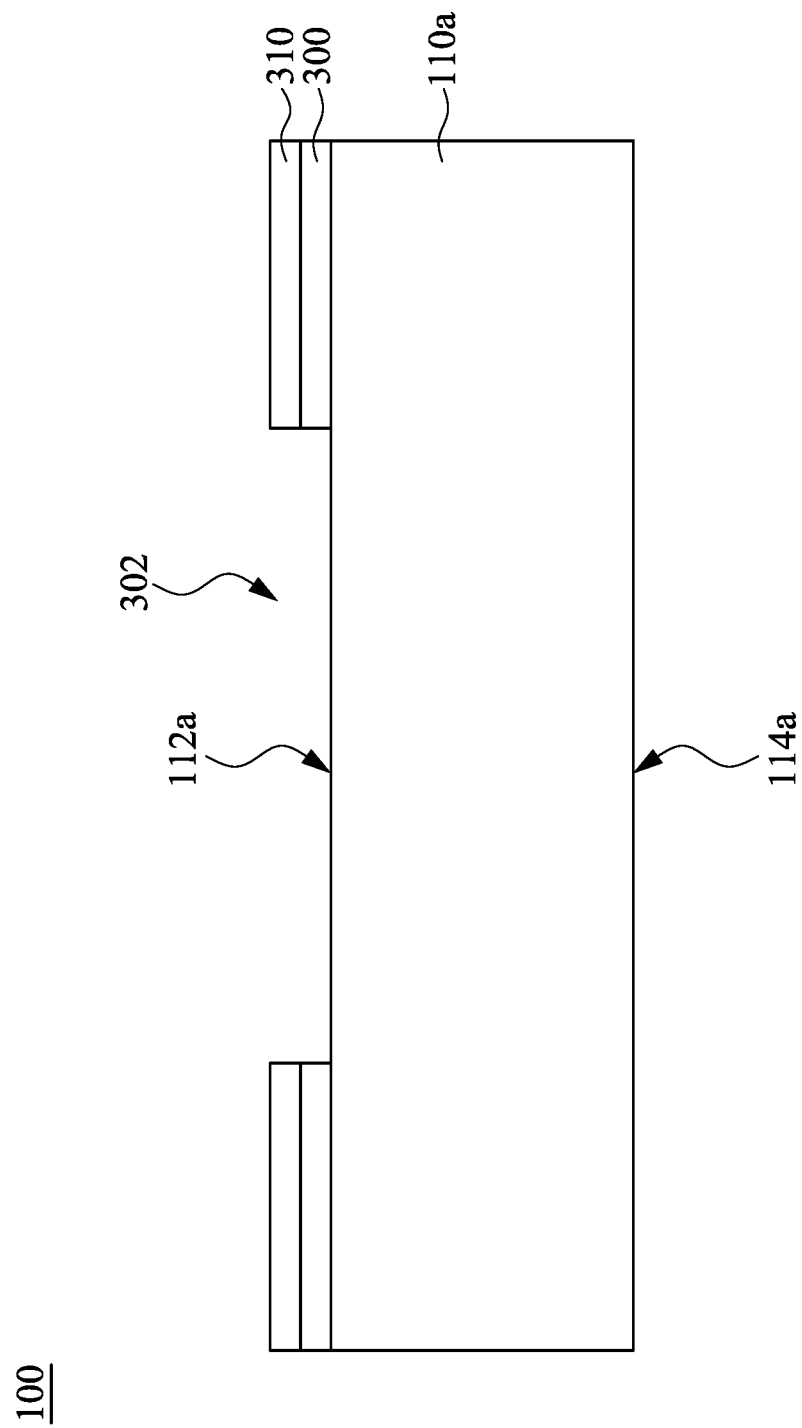

Reference is made to FIG. 3. After the patterning layer 310 is formed, an etching process may be performed on the exposed portion of the hard mask layer 300 by using the patterning layer 310 as an etching mask, so as to form a through hole 302 as a pattern in the hard mask layer 300. After that, a portion of the first surface 112a of the first semiconductor structure 110a is exposed from the through hole 302 of the hard mask layer 300. In some embodiments, the patterning layer 310 may then be removed by a stripping or ashing process to expose the hard mask layer 300 after the pattern is formed in the hard mask layer 300.

Figure 4:
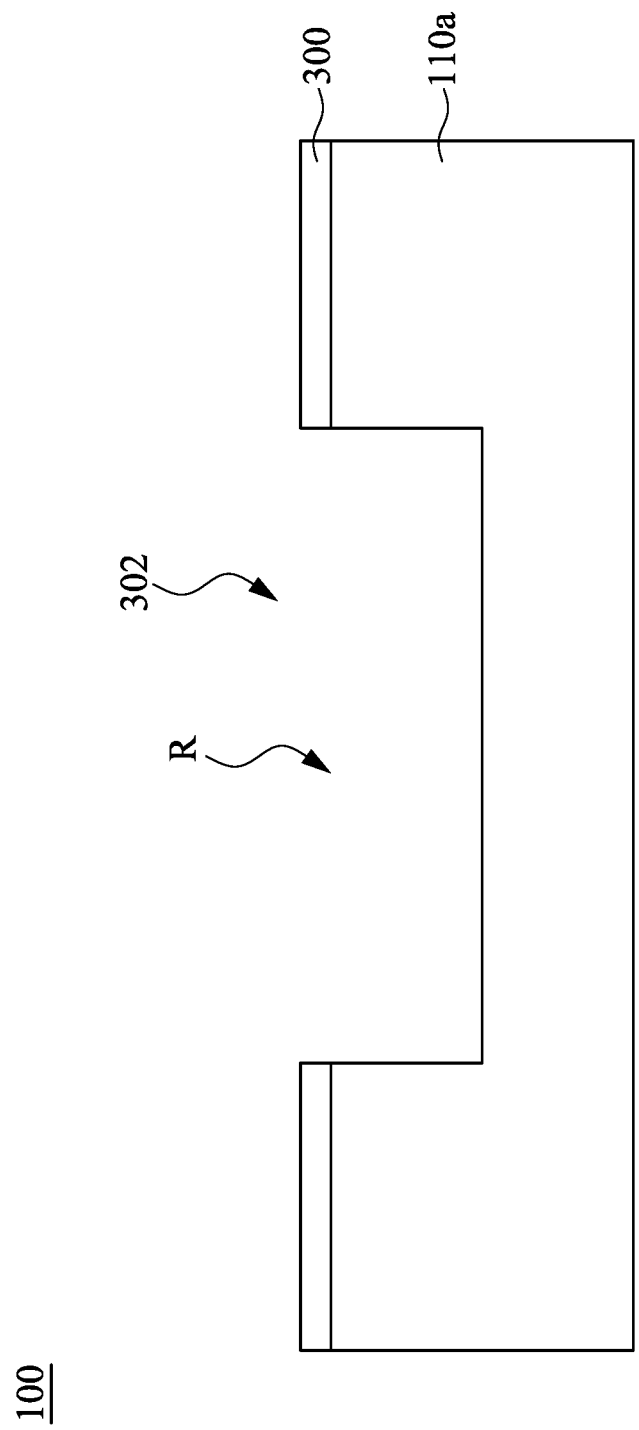

Reference is made to FIG. 4. An etching process is then performed on the exposed portion of the first surface 112a (see FIG. 3) of the first semiconductor structure 110a by using the hard mask layer 300 as an etching mask, so as to remove the exposed portion of the first semiconductor structure 110a and form a recess R in the first semiconductor structure 110a. In some embodiments, the etching process may be a wet etching or a dry etching process. After the etching process, the hard mask layer 300 may be removed by a stripping or ashing process to expose the first semiconductor structure 110a. In some embodiments, a shape of the recess R can be determined by a profile of the through hole 302, such that the shape of the recess R is identical to the profile of the through hole 302. Stated differently, the profile of the through hole 302 can be designed according to a desired shape of the recess R.

Figure 5:
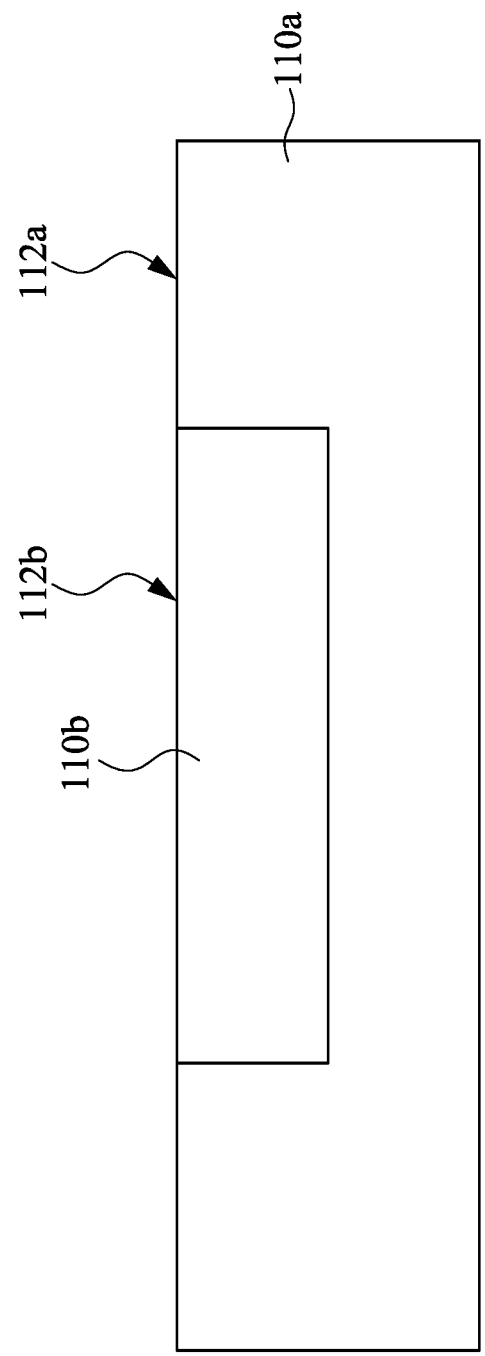

Reference is made to FIG. 5. A second semiconductor structure 110b is then formed in the recess R (see FIG. 4). In some embodiments, the second semiconductor structure 110b may be formed by forming a second semiconductor structure material in the recess R and over the first surface 112a of the first semiconductor structure 110a. The formation of the second semiconductor structure material may be processed by chemical vapor deposition (CVD), high density plasma chemical vapor deposition (HDP CVD), spin-on, sputtering, or other suitable methods. Thereafter, the second semiconductor structure material outside the recess R may be removed by a chemical-mechanical polishing (CMP) process. In some embodiments, the material of the second semiconductor structure 110b includes germanium, elements of group III or group V, or combinations thereof. After the CMP process is performed, the first surface 112a (i.e., a top surface 112a) of the first semiconductor structure 110a is coplanar with a top surface 112b of the second semiconductor structure 110b, and the semiconductor substrate 110 including the first semiconductor structure 110a and the second semiconductor structure 110b embedded in the first semiconductor structure 110a is formed.

FIGS. 6-12 are top views illustrating the semiconductor substrate 110 shown in FIG. 5 according to various embodiments. For example, the recesses R (see FIG. 5) of the first semiconductor structures 110a in FIGS. 6-12 have different shapes and arrangement, and hence the second semiconductor structures 110b formed subsequently in the recesses R in FIGS. 6-12 can have different shapes and arrangement. It is noted that the "shape" herein refers to a profile viewing from the front side 102 (see FIG. 1) of the semiconductor device 100, that is, a profile viewing from a top of the semiconductor device 100.

Figure 6:
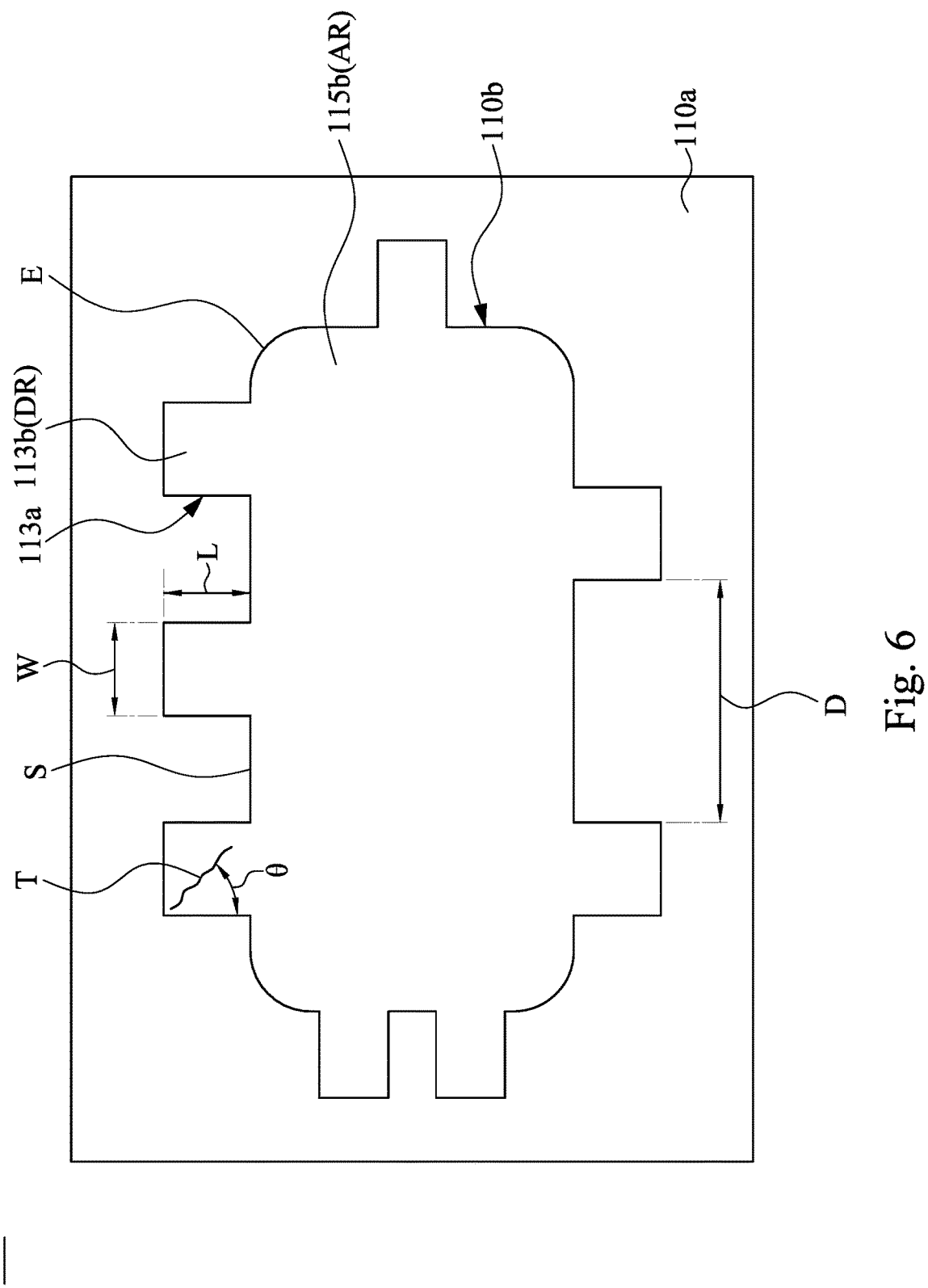
FIGS. 6-12 are top views illustrating the semiconductor substrate shown in FIG. 5 according to various embodiments.

Reference is made to FIG. 6. In some embodiments, the second semiconductor structure 110b may have at least one convex portion 113b on at least one edge E of the second semiconductor structure 110b. Stated differently, the second semiconductor structure 110b may be regarded as including a body portion 115b and at least one convex portion 113b protruding from the body portion 115b. In this case, the first semiconductor structure 110a has at least one concave portion 113a intending therefrom, in which the convex portion 113b of the second semiconductor structure 110b is embedded in the concave portion 113a of the first semiconductor structure 110a. In some embodiments, a shape of the convex portion 113b of the second semiconductor structure 110b is rectangle, in which a length L of the convex portion 113b is larger than a width W of the convex portion 113b. The length L herein refers to a measurement measured from near the edge E of the second semiconductor structure 110b to gradually away from the edge E of the second semiconductor structure 110b, in which the edge E herein refers to the edge E which the convex portion 113b protrudes from. Additionally, the width W herein refers to a measurement perpendicular to the length L. In some embodiments, since the convex portion 113b is embedded in the concave portion 113a, a length of the concave portion 113a is equal to the length L of the convex portion 113b, and a width of the concave portion 113a is equal to the width W of the convex portion 113b.

Accordingly, the dislocation defect occurring at an edge between the first semiconductor structure 110a and the convex portion 113b of the second semiconductor structure 110b can be constrained at the convex portion 113b instead of entering the body portion 115b of the second semiconductor structure 110b. In some embodiments, since an angle θ between a trace T of the dislocation defect and the either side of the convex portion 113b is often about 40 degrees to about 50 degrees, the length L of the convex portion 113b should be larger than the width W of the convex portion 113b to prevent the dislocation defect from extending into the body portion 115b of the second semiconductor structure 110b. As such, the electrical defect can be prevented from occurring at the body portion 115b of the second semiconductor structure 110b, and hence the body portion 115b of the second semiconductor structure 110b can be utilized as an active region AR of the semiconductor device 100 (see FIG. 1), and the convex portion 113b can be utilized as a dummy region DR of the semiconductor device 100 (see FIG. 1). Since the electrical defect is prevented from occurring at the active region AR, pixel leakage of the semiconductor device 100 (see FIG. 1) can be prevented.

In some embodiments, a ratio of an area of the dummy region DR and an area of the second semiconductor structure 110b is in a range from 0.50 to 0.99. Such a range can provide a suitable functional area for the semiconductor device 100 (see FIG. 1). For example, if the ratio of the area of the dummy region DR and the area of the second semiconductor structure 110b is larger than 0.99, the area of the active region AR may be too small to provide enough space for the photodiodes to be disposed, and hence the functionality of the semiconductor device 100 (see FIG. 1) is limited. On the other hand, if the ratio of the area of the dummy region DR and the area of the second semiconductor structure 110b is smaller than 0.50, the area of the dummy region DR may be too small to prevent the dislocation defect from extending into the active region AR, and hence the pixel leakage of the semiconductor device 100 (see FIG. 1) is unable to be prevented.

In some embodiments, the body portion 115b of the second semiconductor structure 110b is substantially in a rectangular shape, in which four sides S of the body portion 115*b* may include different numbers of the convex portions 113*b* protruding therefrom. In some embodiments, distances D between the adjacent convex portions 113*b* are different. In some embodiments, each of the convex portions 113*b* may have different length L and/or different width W as long as each of the convex portions 113*b* has a length L larger than a width W. In some embodiments, the convex portion 113*b* and/or the body portion 115*b* may have round corners, such that the electrical performance can be enhanced.

Figure 7:
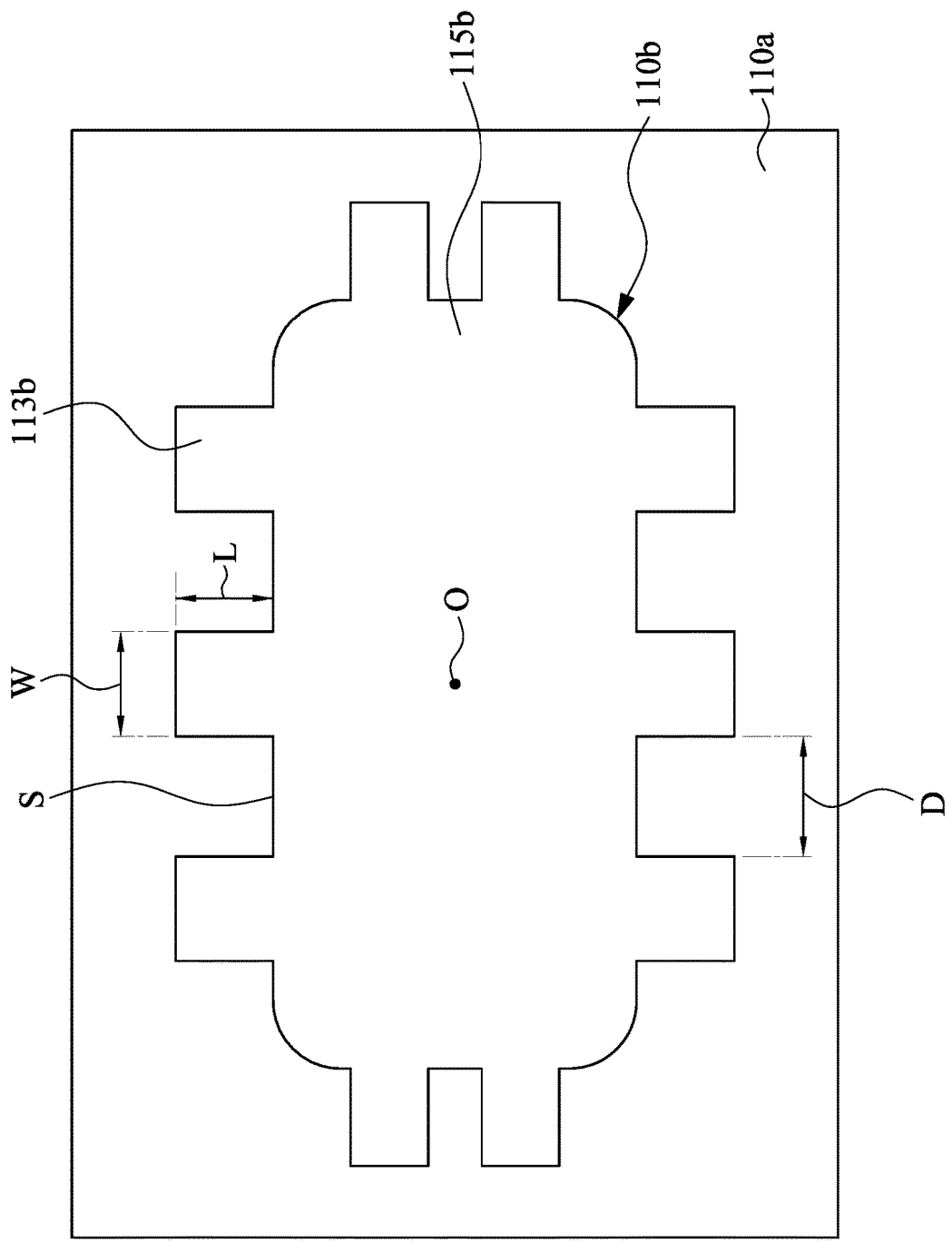

Reference is made to FIG. 7. In some embodiments, as the body portion 115*b* of the second semiconductor structure 110*b* is in a rectangular shape with four sides S, the number of the convex portion 113*b* protruding from the opposite sides S of the body portion 115*b* may be identical, and all of the convex portions 113*b* may have identical length L and width W. In addition, distances D between the adjacent convex portions 113*b* are identical. In such embodiments, the convex portions 113*b* protruding from the opposite sides S of the body portion 115*b* may further be symmetrical to each other with respect to a symmetrical centre O of the body portion 115*b*.

Figure 8:
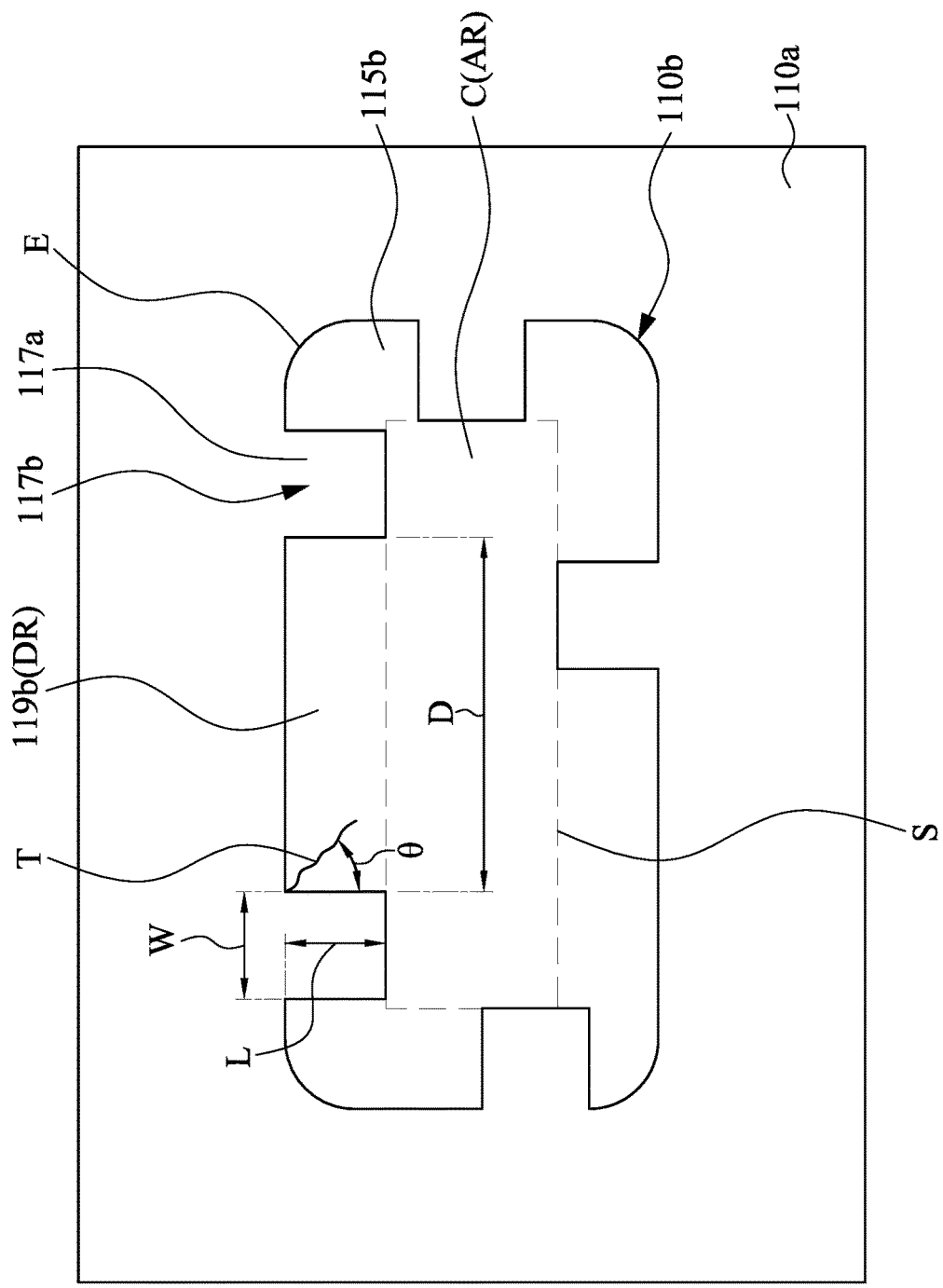

Reference is made to FIG. 8. In some embodiments, the second semiconductor structure 110*b* may have at least one concave portion 117*b* on at least one edge E of the second semiconductor structure 110*b*. Stated differently, the second semiconductor structure 110*b* may be regarded as including a body portion 115*b* and at least one concave portion 117*b* indenting from the body portion 115*b*. In this case, the first semiconductor structure 110*a* has at least one convex portion 117*a* protruding therefrom, in which the convex portion 117*a* of the first semiconductor structure 110*a* is embedded in the concave portion 117*b* of the second semiconductor structure 110*b*. In some embodiments, a shape of the concave portion 117*b* of the second semiconductor structure 110*b* is rectangle, in which a length L of the concave portion 117*b* is larger than a width W of the concave portion 117*b*. The length L herein refers to a measurement measured from near the edge E of the second semiconductor structure 110*b* to gradually away from the edge E of the second semiconductor structure 110*b*, in which the edge E herein refers to the edge E which the convex portion 113*b* indents from. Additionally, the width W herein refers to a measurement perpendicular to the length L. Since the convex portion 117*a* is embedded in the concave portion 117*b*, a length of the convex portion 117*a* is equal to the length L of the concave portion 117*b*, and a width of the convex portion 117*a* is equal to the width W of the concave portion 117*b*.

In the embodiment shown in FIG. 8, the second semiconductor structure 110*b* may also be regarded as including a centre portion C and at least two convex portions 119*b* protruding from the centre portion C, in which the convex portion 119*b* is adjacent the concave portion 117*b* of the second semiconductor structure 110*b*, and the convex portion 119*b* can be in a regular shape or an irregular shape. Accordingly, the dislocation defect occurring at an edge between the first semiconductor structure 110*a* and the convex portion 119*b* of the second semiconductor structure 110*b* can be constrained at the convex portion 119*b* instead of entering the centre portion C of the second semiconductor structure 110*b*. In some embodiments, since an angle θ between a trace T of the dislocation defect and the either side of the convex portion 119*b* is often about 45 degrees to about 50 degrees, the length L of the concave portion 117*a* should be larger than the width W of the concave portion 117*a*, such that the dislocation defect can be constrained at the convex portion 119*b* to prevent the dislocation defect from extending into the centre portion C of the second semiconductor structure 110*b*. As such, the electrical defect can be prevented from occurring at the centre portion C of the second semiconductor structure 110*b*, and hence the centre portion C of the second semiconductor structure 110*b* can be utilized as an active region AR of the semiconductor device 100 (see FIG. 1), and the convex portion 119*b* can be utilized as a dummy region DR of the semiconductor device 100 (see FIG. 1). Since the electrical defect is prevented from occurring at the active region AR, pixel leakage of the semiconductor device 100 (see FIG. 1) can be prevented. In some embodiments, a ratio of an area of the dummy region DR and an area of the second semiconductor structure 110*b* is in a range from 0.50 to 0.99. Such a range can provide a suitable functional area for the semiconductor device 100 (see FIG. 1) and effectively prevent the pixel leakage from occurring as previously discussed.

In some embodiments, the centre portion C of the second semiconductor structure 110*b* is substantially in a rectangular shape, in which four sides S of the centre portion C may include different numbers of the concave portions 117*b*. In some embodiments, distances D between the adjacent concave portions 117*b* are different. In some embodiments, each of the concave portions 117*b* may have different length L and/or different width W as long as each of the concave portions 117*b* has a length L larger than a width W. In some embodiments, the concave portions 117*b* and/or the body portion 115*b* may have round corners, such that the electrical performance can be enhanced.

Figure 9:
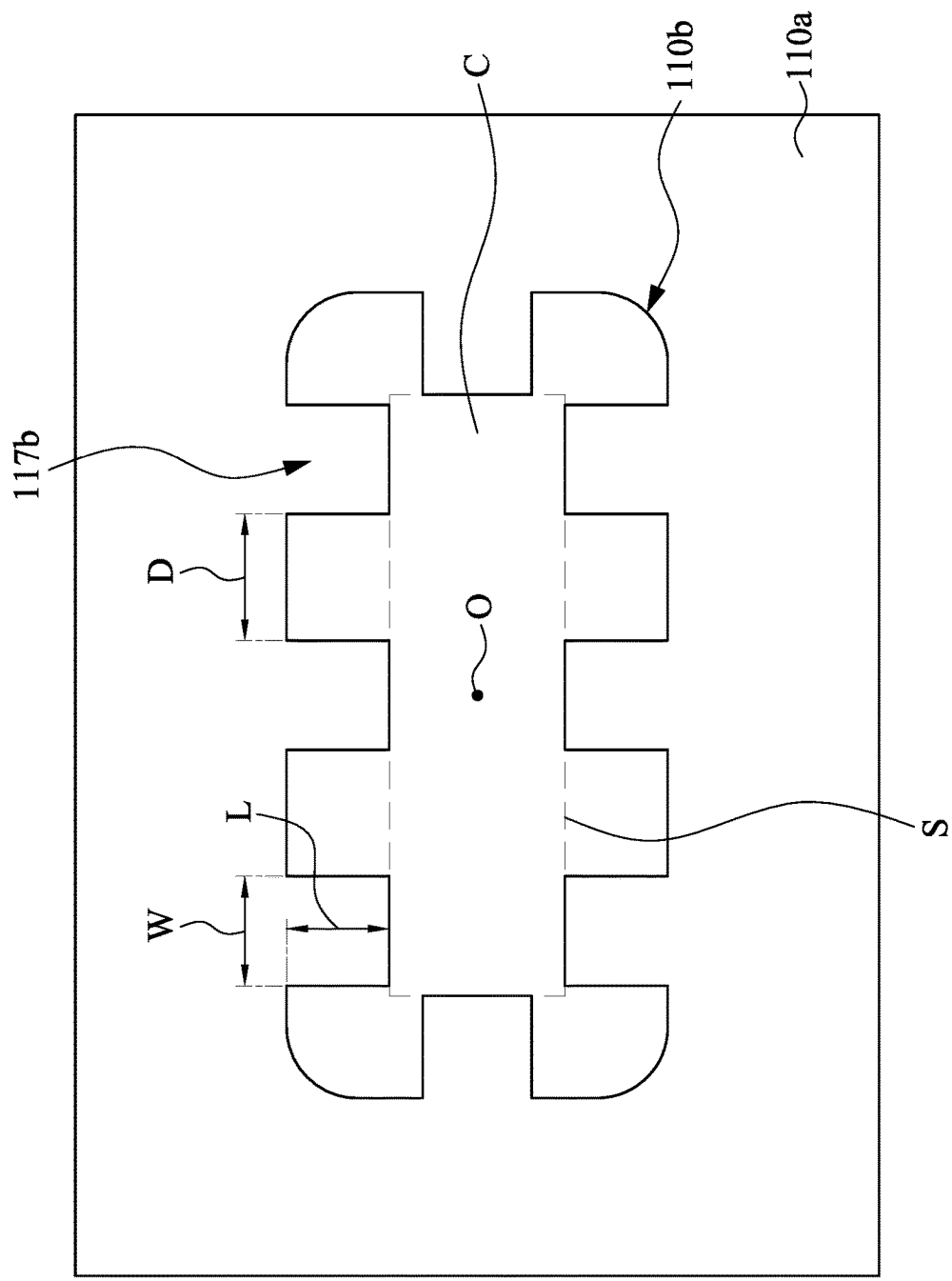

Reference is made to FIG. 9. In some embodiments, as the centre portion C of the second semiconductor structure 110*b* is in a rectangular shape with four sides S, the number of the concave portions 117*b* at opposite sides S of the centre portion C may be identical, and all of the concave portions 117*b* may have identical length L and width W. In addition, distances D between the adjacent concave portions 117*b* are identical. In such embodiments, the concave portions 117*b* at opposite sides S of the centre portion C may further be symmetrical to each other with respect to a symmetrical centre O of the centre portion C.

In some embodiments, the shape of each of the convex portions 113*b* shown in FIGS. 6-7 and the shape of each of the concave portions 117*b* shown in FIGS. 8-9 may include trapezoid, inverted trapezoid, parallelogram, or combinations thereof.

Figure 10:
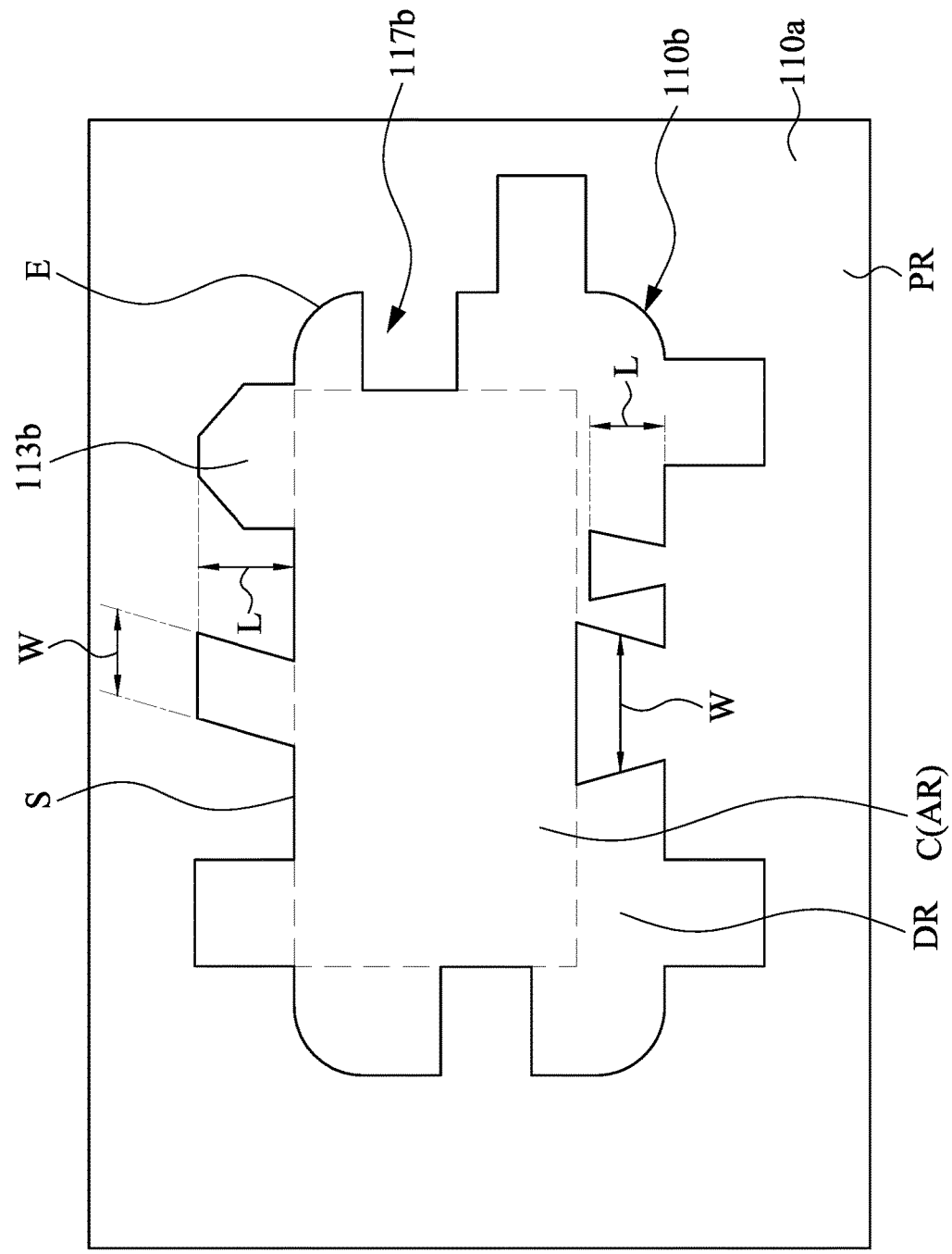

Reference is made to FIG. 10. In some embodiments, The second semiconductor structure 110*b* includes a plurality of convex portions 113*b* and a plurality of concave portions 117*b* at edges E of the second semiconductor structure 110*b*, in which a shape of each of the convex portions 113*b* and the concave portions 117*b* includes rectangle, trapezoid, inverted trapezoid, parallelogram, or combinations thereof. Furthermore, a length L of each of the convex portions 113*b* and the concave portions 117*b* is larger than a width W of each of the convex portions 113*b* and the concave portions 117*b*. In such embodiments, a length L of the trapezoid (or the inverted trapezoid) is a height of the trapezoid (or the inverted trapezoid), and a width W of the trapezoid (or the inverted trapezoid) is an average length of the parallel sides of the trapezoid (or the inverted trapezoid). Similarly, a length L of the parallelogram is a height of the parallelogram, and a width W of the parallelogram is a length of the side of the parallelogram perpendicular to the height of the parallelogram. In addition, in the embodiments which the shapes of the convex portions 113*b* and/or the concave portions 117*b* include combinations of rectangle, trapezoid, inverted trapezoid, or parallelogram, the length L refers to a measurement measured from near the edge E of the second semiconductor structure 110b to gradually away from the edge E of the second semiconductor structure 110b, in which the edge E herein refers to the edge E which the convex portion 113b protrudes from and/or the concave portion 117b intends from; and the width W refers to an average of a maximum and a minimum measurement which are perpendicular to the length L.

In some embodiments, the semiconductor substrate 110 may be regarded as including a centre portion C and a plurality of convex portions 113b and a plurality of concave portions 117b at sides S of the centre portion C. In some embodiments, the centre portion C is in a rectangular shape. The centre portion C of the second semiconductor structure 110b may be utilized as an active region AR of the semiconductor device 100 (see FIG. 1), and the rest of the second semiconductor structure 110b may be utilized as a dummy region DR. In some embodiments, a ratio of an area of the dummy region DR and an area of the second semiconductor structure 110b is in a range from 0.50 to 0.99. Such a range can provide a suitable functional area for the semiconductor device 100 (see FIG. 1) and effectively prevent the pixel leakage from occurring as previously discussed.

In some embodiments, an area surrounding the first semiconductor structure 110a may be utilized as a periphery region PR of the semiconductor device 100. In some embodiments, the active region AR and the dummy region DR may serve as a photodiode, in which the photodiode may include a photosensitive diode (p-n junction) for receiving signals proportional to the intensity or light received by the photosensitive diodes during a light sampling interval. Circuitry for providing functions other than photodiodes, such as input output buffers and logic circuitry, may be formed in the periphery region PR. This additional circuitry may include logic circuitry for operating the sensor array and circuitry for communicating the data corresponding to the sensed light to external devices.

Figure 11:
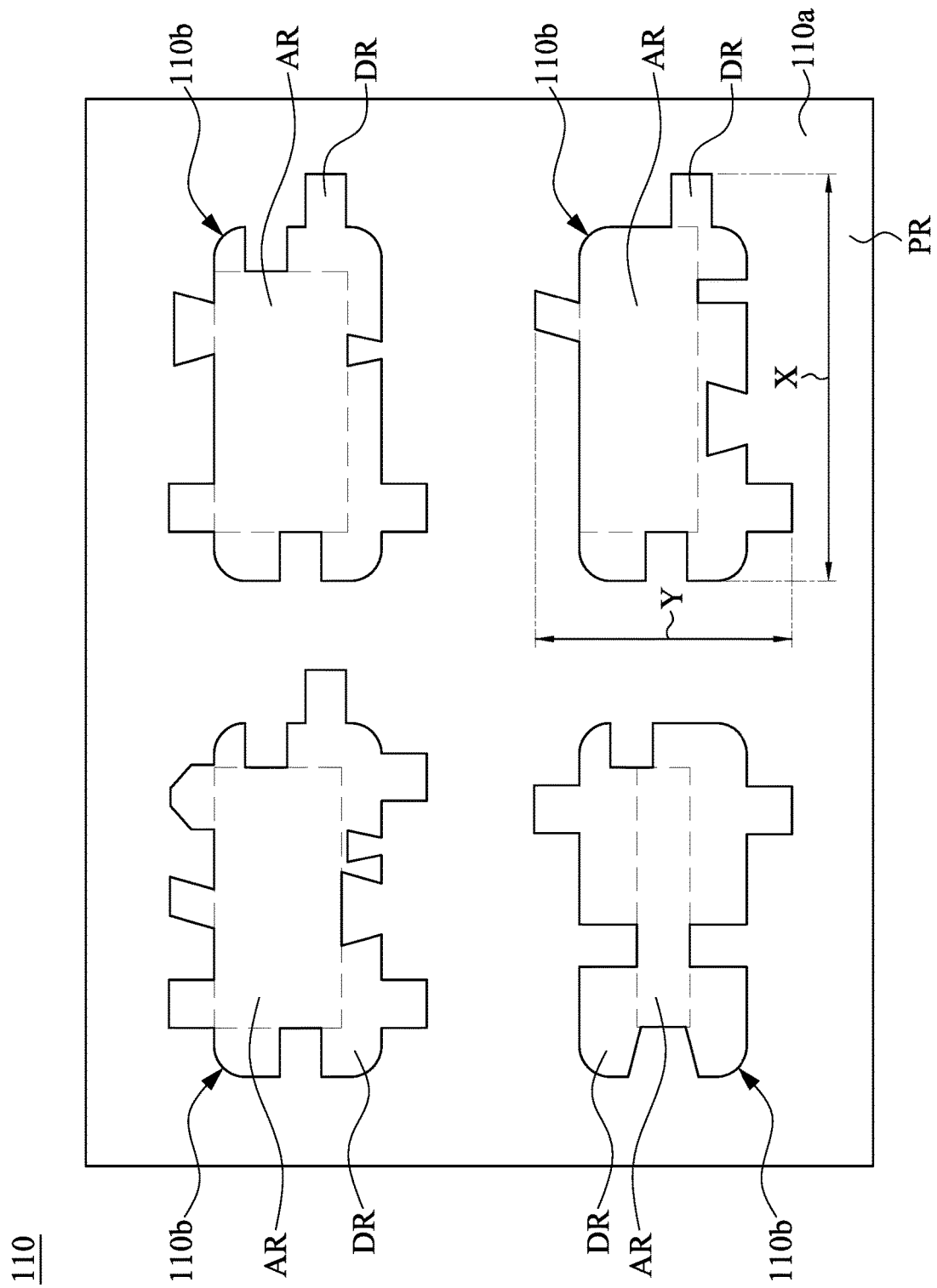

Reference is made to FIG. 11. In some embodiments, the semiconductor device 100 (see FIG. 1) may include a pixel array including a plurality of pixels, in which each of the pixels includes the first semiconductor structure 110a and the second semiconductor structure 110b. Stated differently, each of the pixels includes the active region AR, the dummy region DR, and the periphery region PR. In some embodiments, the semiconductor device 100 may include four pixels, in which the pixels are arranged in a 2×2 array. In addition, all of the pixels can be formed simultaneously in a same process with one hard mask layer 300 (see FIG. 4), and the first semiconductor structure 110a of each of the pixels may be interconnected with each other. In some embodiments, a shape of the active region AR of each of the pixels is different, and a shape of the dummy region DR of each of the pixels is different. In some embodiments, when the active region AR of each of the pixels is in a rectangular shape, each of the pixels may have a long axis X and a short axis Y, in which the long axis X is parallel to the length of the active region AR, and the short axis Y is parallel to the width of the active region AR. In some embodiments, the long axis X of each of the pixels in the pixel array extends in a same direction, and the short axis Y of each of the pixels in the pixel array extends in a same direction, as shown in FIG. 11.

Figure 12:
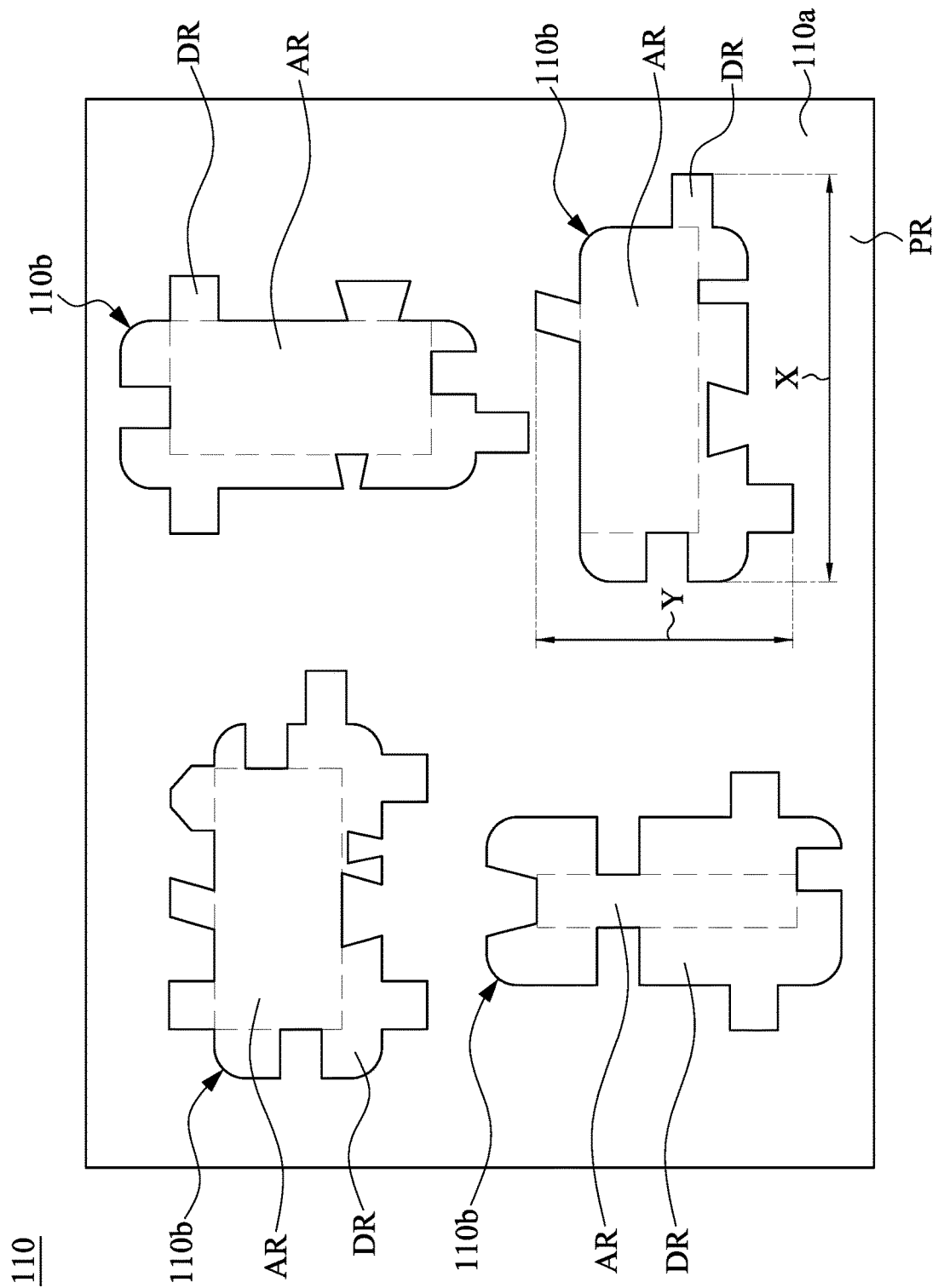

Reference is made to FIG. 12. In some embodiments, the semiconductor device 100 may include four pixels, in which the pixels are arranged in a 2×2 array. In some embodiments, when the active region AR of each of the pixels is in a rectangular shape, each of the pixels may have a long axis X and a short axis Y, in which the long axis X is parallel to the length of the active region AR, and the short axis Y is parallel to the width of the active region AR. In some embodiments, the long axis X of one of the pixels and the long axis X of an adjacent pixel extend in two directions perpendicular to each other, as shown in FIG. 12.

Figure 13:
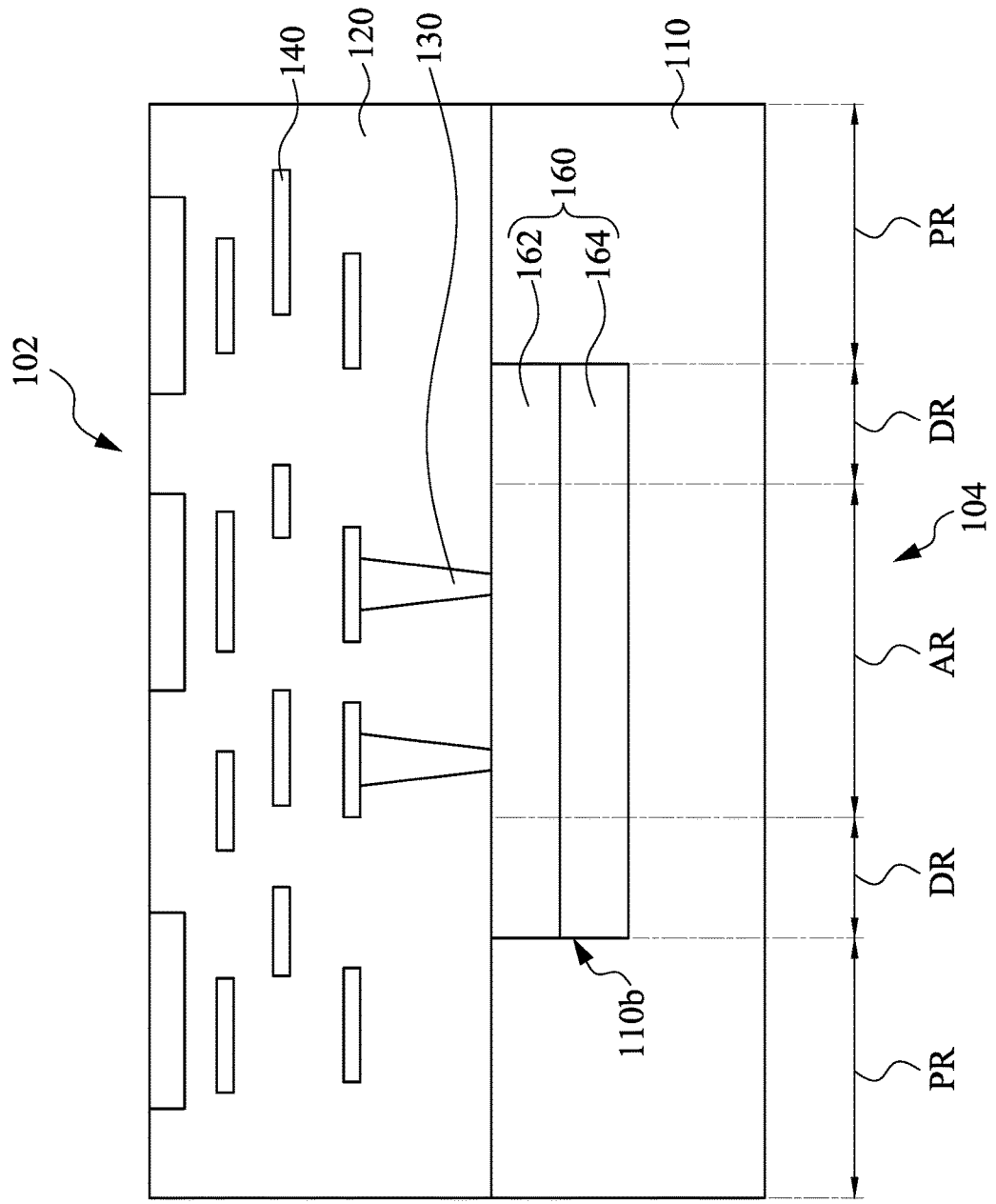
FIGS. 13 and 14 are cross-sectional views illustrating a method for manufacturing the semiconductor device shown in FIG. 1 at various stages according to some embodiments.
Figure 14:
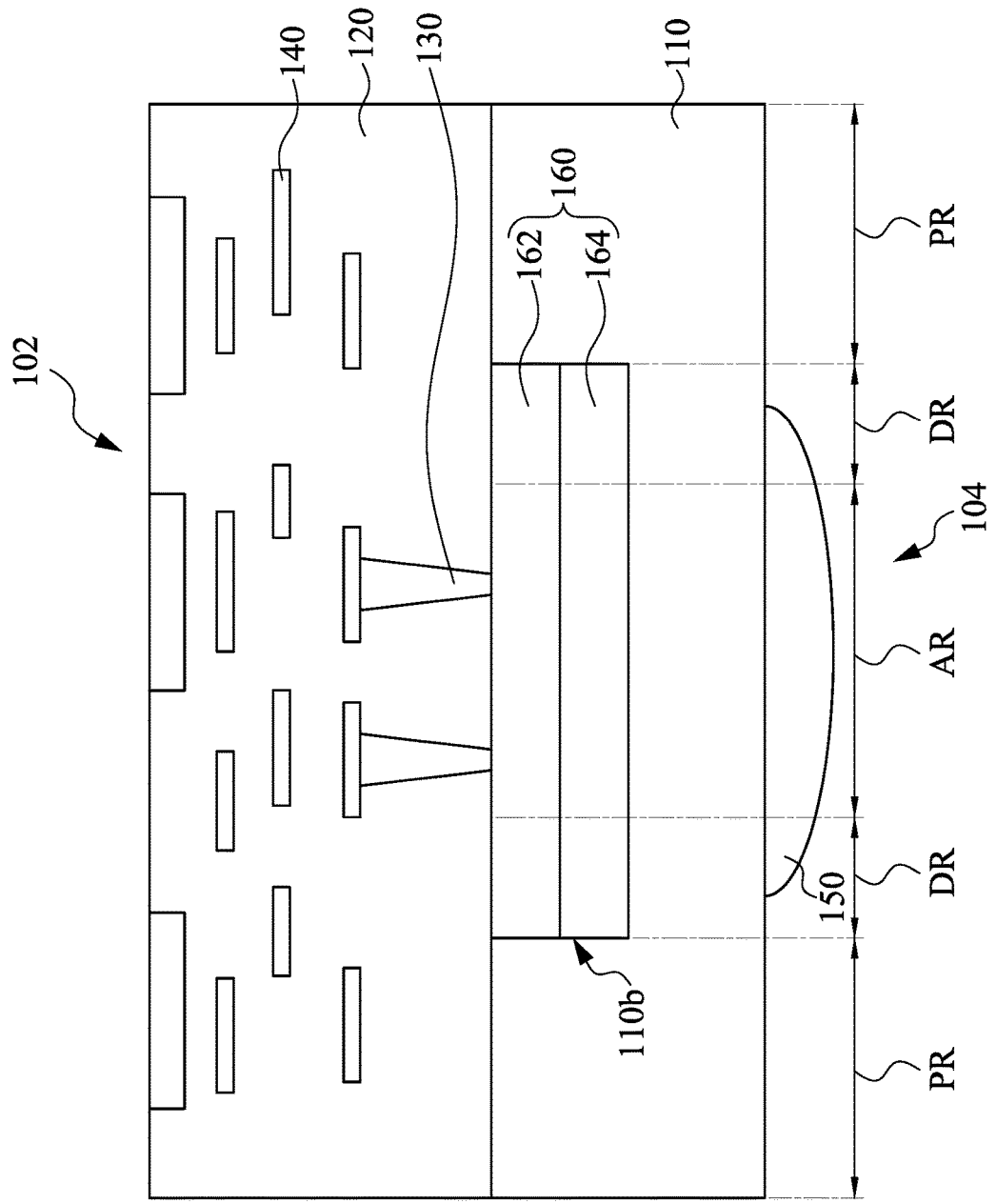

FIGS. 13 and 14 are cross-sectional views illustrating a method for manufacturing the semiconductor device 100 shown in FIG. 1 at various stages according to some embodiments.

Reference is made to FIG. 13. After the semiconductor substrate 110 is formed, the semiconductor substrate 110 is processed using front end of the line (FEOL) processes to form a photodiode 160 in the array region AR of the second semiconductor structure 110b. The second semiconductor structure 110b serves as a photodiode 160 which may be formed as two opposing doping type regions, such as an n-type region 162 and a p-type region 164, to form a p-n junction for a photodiode 160. After that, the dielectric layer 120 is formed overlying the semiconductor substrate 110 from the front side 102 of the semiconductor device 100. The conductive contact 130 and the metallization layers 140 are formed within the dielectric layer 120. Since the semiconductor device 100 is a BSI image sensor device which is operated to sense the incident light projected from its back side 104, the conductive contacts 130 can be formed from the front side 102 of the semiconductor device 100 and in contact with the photodiode 160 in the active region AR, and the metallization layers 140 can be formed over the dummy region DR and the periphery region PR as well as the active region AR from the front side 102 of the semiconductor device 100 without the concern of shielding the incident light projected into the photodiode 160 in the active region AR. Although not illustrated herein, a passivation layer may be formed overlying the dielectric layer 120 from the front side 102 of the semiconductor device 100.

Reference is made to FIG. 14. In some embodiments, the micro-lens 150 may be formed over the semiconductor substrate 110 from the back side 104 of the semiconductor device 100 over the active region AR to further improve the light reception. Although not illustrated herein, a color filter that selectively pass light of certain frequencies which may include red, green and blue colors (R/G/B) are formed over the back side 104 of the semiconductor device 100 over the active region AR to create color pixels. In some embodiments, the color filter is formed between the semiconductor substrate 110 and the micro-lens 150. In some embodiments, the semiconductor device 100 may be an image sensor device such as time-of-flight (TOF) image sensor or time-of-flight three-dimensional (TOF 3D) image sensor, which may be operated for sensing incident light. The semiconductor device 100 can be applied in fields of face recognition, vehicle sensors for reverse and anti-collision, virtual reality (VR), and augmented reality (AR).

Figure 15:
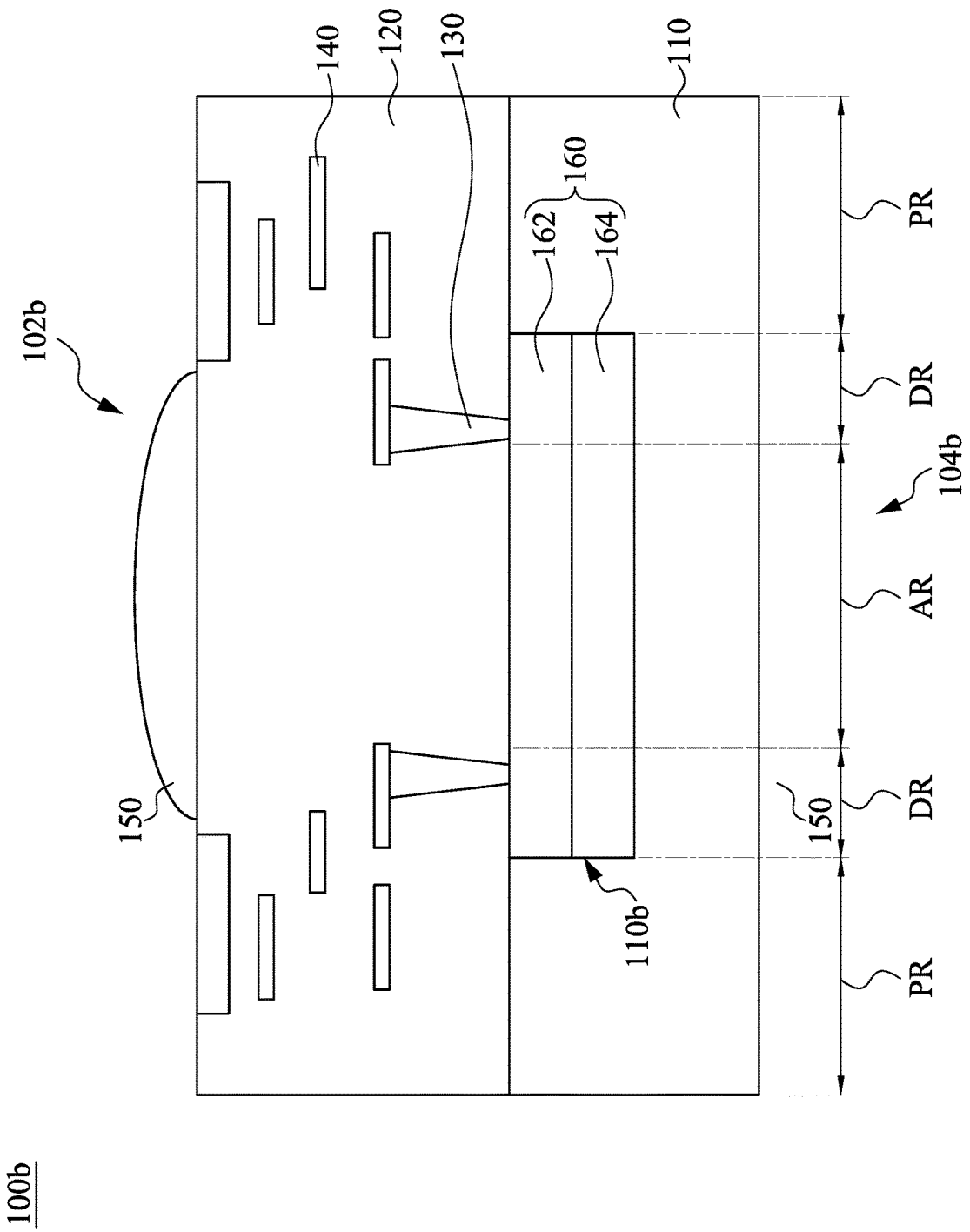
FIG. 15 is a cross-sectional view illustrating a semiconductor device in accordance with some embodiments of the present disclosure.

FIG. 15 is a cross-sectional view illustrating a semiconductor device in accordance with some embodiments of the present disclosure.

Reference is made to FIG. 15. A semiconductor device 100b has a front side 102b and a back side 104b. In some embodiments, the semiconductor device 100b is a front side illuminated (FSI) image sensor device, which is operated to sense the incident light projected from its front side 102b. Furthermore, FIG. 15 may illustrate only a portion of the semiconductor device 100b. Similar to the semiconductor device 100 shown in FIG. 14, the semiconductor device 100b may include a semiconductor substrate 110, a dielectric layer 120, conductive contacts 130, metallization layers 140, and micro-lens 150. The at least one difference between the semiconductor device 100*b* shown in FIG. 15 and the semiconductor device 100 shown in FIG. 14 is that micro-lens 150 are formed overlying the semiconductor substrate 110 from the front side 102*b* of the semiconductor device 100*b*. Additionally, since the semiconductor device 100*b* is operated to sense the incident light projected from its front side 102*b*, the conductive contacts 130 and the metallization layers 140 are formed to avoid the light path of the incident light. In some embodiments, the conductive contacts 130 are formed from the front side 102 of the semiconductor device 100 and are in contact with the dummy region DR without shielding the active region AR. Furthermore, the metallization layers 140 are formed over the dummy region DR and the periphery region PR without shielding the active region AR. Accordingly, the incident light will not be shielded by the conductive contacts 130 and the metallization layers 140. Although not illustrated herein, a color filter that selectively pass light of certain frequencies which may include red, green and blue colors (R/G/B) are formed from the back side 104*b* of the semiconductor device 100 over the active region AR to create color pixels. In some embodiments, the color filter is formed between the dielectric layer 120 and the micro-lens 150.

Based on the aforementioned descriptions, since the semiconductor device includes at least one convex portion and concave portion at the edge of the second semiconductor structure, and the length of each of the convex portion and concave portion is larger than the width of each of the convex portion and concave portion, the dislocation defect occurring at an edge between the first semiconductor structure and the second semiconductor structure can be constrained at the dummy region of the semiconductor device. Accordingly, the electrical defect can be prevented from occurring at the active region of the semiconductor device, and hence the problem of pixel leakage can be solved.

In some embodiments, a semiconductor device includes a first semiconductor structure and a second semiconductor structure. The first semiconductor structure includes silicon. The second semiconductor structure is embedded in the first semiconductor structure, in which the second semiconductor structure has at least one convex portion and at least one concave portion. The convex portion and the concave portion are on at least one edge of the second semiconductor structure, and a shape of the concave portion includes rectangle, trapezoid, inverted trapezoid, or parallelogram. The second semiconductor structure comprises germanium, elements of group III or group V, or combinations thereof.

In some embodiments, an image sensor device includes a pixel array including a plurality of pixels, in which each of the pixels includes a first semiconductor structure and a second semiconductor structure. The second semiconductor structure is embedded in the first semiconductor structure, in which the second semiconductor structure has at least one convex portion and at least one concave portion, the convex portion and the concave portion are on at least one edge of the second semiconductor structure, and a length of the convex portion is larger than a width of the convex portion.

In some embodiments, a method for manufacturing an image sensor device includes: forming a plurality of pixels, in which each of the pixels are arranged in array. Forming the pixels includes: forming a plurality of recesses in a first semiconductor structure of a first semiconductor material, in which each of the recesses has at least one convex portion and at least one concave portion on at least one edge of the recess, and a shape of the convex portion is rectangle, trapezoid, inverted trapezoid, or parallelogram; and filling the recesses with a second semiconductor material, such that a plurality of second semiconductor structures are respectively formed in the recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing an image sensor device, comprising:
    forming a plurality of pixels, wherein the pixels are arranged in array, and forming the pixels comprises:
        forming a plurality of recesses in a first semiconductor structure of a first semiconductor material, wherein each of the recesses has at least one convex portion and at least one concave portion on at least one edge of the recess, and a shape of the convex portion is rectangle, trapezoid, inverted trapezoid, or parallelogram in a top view; and
        filling the recesses with a second semiconductor material, such that a plurality of second semiconductor structures are respectively formed in the recesses, wherein one of the second semiconductor structures comprises a convex portion filling in the at least one convex portion of one of the recesses, and a top surface of the convex portion of said one of the second semiconductor structures is substantially coplanar with a top surface of the first semiconductor structure.

2. The method for manufacturing the image sensor device of claim 1, further comprising:
    forming at least one conductive contact on the convex portion of said one of the second semiconductor structures.

3. The method for manufacturing the image sensor device of claim 1, further comprising:
    forming a metallization layer over the top surface of the first semiconductor structure and the top surface of the convex portion of said one of the second semiconductor structures, such that the convex portions and the concave portions of the recesses are covered by the metallization layer.

4. The method for manufacturing the image sensor device of claim 1, wherein the first semiconductor structure comprises silicon, and the second semiconductor structures comprise germanium.

5. The method for manufacturing the image sensor device of claim 1, further comprising:
    doping bottom portions of the second semiconductor structures with first dopants having a first conductivity type; and
    doping top portions of the second semiconductor structures with second dopants having a second conductivity type different from the first conductivity type.

6. The method for manufacturing the image sensor device of claim 1, wherein a shape of the at least one convex portion is different from a shape of the at least one concave portion in the top view.

7. The method for manufacturing the image sensor device of claim 1, wherein the pixels have different shapes in the top view.

8. The method for manufacturing the image sensor device of claim 1, further comprising forming a dielectric layer to cover the second semiconductor structures and the first semiconductor structure, wherein the dielectric layer is in contact with the convex portion of said one of the second semiconductor structures.

9. A method for manufacturing an image sensor device, comprising:
   recessing a semiconductor substrate to form a first recess and a second recess in the semiconductor substrate;
   filling the first recess and the second recess with a semiconductor material to form a first pixel in the first recess and a second pixel in the second recess, wherein the first pixel comprises:
      a first body portion having a first edge and a second edge opposite to the first edge in a top view; and
      a first protruding portion protruding from the first edge of the first body portion, wherein the semiconductor substrate is in contact with the first protruding portion and the first edge of the first body portion;
   wherein the second pixel comprises:
      a second body portion having a rectangular shape in the top view; and a second protruding portion and a third protruding portion protruding from the second body portion, wherein a portion of the semiconductor substrate is directly between the second protruding portion and the third protruding portion and in contact with the second body portion of the second pixel;
   forming a metallization layer over the first pixel, the second pixel, and the semiconductor substrate; and
   forming a micro-lens covering the first pixel.

10. The method for manufacturing the image sensor device of claim 9, wherein the first recess and the second recess have different shapes in the top view.

11. The method for manufacturing the image sensor device of claim 9, wherein the second protruding portion and the third protruding portion have different shapes in the top view.

12. The method for manufacturing the image sensor device of claim 9, wherein the first body portion and the second body portion have different shapes in the top view.

13. The method for manufacturing the image sensor device of claim 9, wherein the second protruding portion of the second pixel faces the first pixel, and the third protruding portion faces away from the first pixel.

14. The method for manufacturing the image sensor device of claim 9, wherein the first pixel further comprises a fourth protruding portion protruding from the first protruding portion, an area of the fourth protruding portion is smaller than an area of the first protruding portion in the top view, and a part of the first protruding portion is directly between the first body portion and the fourth protruding portion of the first pixel.

15. A method for manufacturing an image sensor device, comprising:
   forming a first recess and a second recess in a silicon substrate;
   depositing a semiconductor material in the first recess and the second recess to form a first pixel in the first recess and a second pixel in the second recess of the silicon substrate, wherein in a top view, the first pixel and the second pixel are arranged in a first direction, a top surface of the first pixel defined by an interface between the semiconductor material in the first recess and the silicon substrate has a maximum length extending in the first direction, and a top surface of the second pixel defined by an interface between the semiconductor material in the second recess and the silicon substrate has a maximum length extending in a second direction perpendicular to the first direction;
   forming a metallization layer over the first pixel, the second pixel, and the silicon substrate; and
   forming a micro-lens covering the first pixel.

16. The method for manufacturing the image sensor device of claim 15, wherein the first pixel comprises:
   an active portion having a rectangular shape in the top view; and
   dummy portions laterally protruding from edges of the active portion, wherein the silicon substrate is in contact with the edges of the active portion in the top view, and an area of the active portion is greater than each of areas of the dummy portions in the top view.

17. The method for manufacturing the image sensor device of claim 16, wherein in the top view, a ratio of the areas of the dummy portions and of the first pixel is in a range from 0.50 to 0.99.

18. The method for manufacturing the image sensor device of claim 16, wherein the micro-lens partially covers the dummy portions.

19. The method for manufacturing the image sensor device of claim 16, further comprising:
   forming a conductive contact to be in contact with one of the dummy portions of the first pixel but spaced apart from the active portion of the first pixel, and the metallization layer is formed over the conductive contact.

20. The method for manufacturing the image sensor device of claim 15, wherein an area of an entirety of the top surface of the first pixel is different from an area of an entirety of the top surface of the second pixel in the top view.

* * * * *